United States Patent [19]

Sorensen et al.

[11] Patent Number: 5,782,974
[45] Date of Patent: Jul. 21, 1998

[54] METHOD OF DEPOSITING A THIN FILM USING AN OPTICAL PYROMETER

[75] Inventors: Carl A. Sorensen, Morgan Hill; Wendell T. Blonigan, Fremont, both of Calif.

[73] Assignee: Applied Materials, Inc., Santa Clara, Calif.

[21] Appl. No.: 649,927

[22] Filed: May 16, 1996

Related U.S. Application Data

[60] Continuation of Ser. No. 461,076, Jun. 5, 1995, abandoned, which is a division of Ser. No. 190,421, Feb. 2, 1994, Pat. No. 5,549,756.

[51] Int. Cl.[6] .............................. C23C 14/54; G01J 5/08
[52] U.S. Cl. ........................... 117/82; 117/85; 117/86; 117/89; 117/92; 118/666; 118/712; 427/10; 250/341.6; 374/121
[58] Field of Search ........................... 117/82, 84, 85, 117/86, 89, 90, 92; 118/666, 663, 712, 713, 725, 728, 723 R, 723 IR; 427/10, 165, 166, 255; 250/341.6, 338.1; 374/120, 121, 127

[56] References Cited

U.S. PATENT DOCUMENTS

| | | | |
|---|---|---|---|
| 3,664,942 | 5/1972 | Havas et al. | 204/192 |
| 4,203,799 | 5/1980 | Sugawara et al. | 117/86 |
| 4,806,321 | 2/1989 | Nishizawa et al. | 422/245 |
| 5,009,485 | 4/1991 | Hall | 427/10 |
| 5,062,386 | 11/1991 | Christensen | 118/725 |
| 5,091,320 | 2/1992 | Aspnes et al. | 437/8 |
| 5,098,198 | 3/1992 | Nulman et al. | 374/121 |
| 5,147,498 | 9/1992 | Nashimoto | 156/627 |
| 5,188,458 | 2/1993 | Thompson et al. | 374/121 |
| 5,209,182 | 5/1993 | Ohta et al. | 118/666 |
| 5,258,824 | 11/1993 | Carlson et al. | 356/382 |
| 5,275,629 | 1/1994 | Ajika et al. | 29/25.01 |
| 5,334,251 | 8/1994 | Nashimoto | 118/725 |
| 5,399,018 | 3/1995 | Hollander et al. | 374/121 |
| 5,481,112 | 1/1996 | Marui | 250/339.14 |
| 5,487,127 | 1/1996 | Gronet | 392/416 |
| 5,549,756 | 8/1996 | Sorensen et al. | 117/715 |

FOREIGN PATENT DOCUMENTS

| | | |
|---|---|---|
| 2134821 | 5/1990 | Japan . |
| 3156325 | 7/1991 | Japan . |
| 3156326 | 7/1991 | Japan . |
| 3156327 | 7/1991 | Japan . |
| 570291 | 3/1993 | Japan . |

OTHER PUBLICATIONS

Notice of Allowability and Notice of Allowance and Issue Fee Due dated Feb. 6, 1996 with PTO-892 in application serial No. 08/190,421, filed Feb. 2, 1994.
JAPIO, abstract, Japan Patent No. 3-156327, Fujitsu Ltd.

*Primary Examiner*—R. Bruce Breneman
*Assistant Examiner*—Anita Alanko
*Attorney, Agent, or Firm*—William K. Konrad

[57] ABSTRACT

A temperature measurement system for use in a thin film deposition system is based on optical pyrometry on the backside of the deposition substrate. The backside of the deposition substrate is viewed through a channel formed in the susceptor of the deposition system. Radiation from the backside of the deposition substrate passes through an infrared window and to an infrared detector. The signal output by the infrared detector is coupled to electronics for calculating the temperature of the deposition substrate in accordance with blackbody radiation equations. A tube-like lightguide shields the infrared detector from background radiation produced by the heated susceptor.

30 Claims, 2 Drawing Sheets

METHOD OF DEPOSITING A THIN FILM USING AN OPTICAL PYROMETER

This is a continuation of application Ser. No. 08/461,076 filed on Jun. 5, 1995, now abandoned, which is a division of application Ser. No. 08/190,421, filed Feb. 2, 1994, now U.S. Pat. No. 5,549,756.

FIELD OF THE INVENTION

The present invention is directed to the field of thin film deposition systems.

BACKGROUND OF THE INVENTION

Modern liquid crystal displays, such as the active matrix liquid crystal displays used in some portable computers, are formed by the deposition of thin films on a glass substrate. These thin films are subsequently processed using standard photolithography techniques to form the circuitry which drives the liquid crystal display. This circuitry typically includes amorphous silicon field effect transistors and is formed directly on the surface of the glass substrate to optimize the integration of these displays. The satisfactory performance of the resulting liquid crystal displays is dependent on the uniformity of transistor characteristics, across the surface of the glass substrate and on the level of performance exhibited by individual transistor elements. Deposition of thin films of semiconductors, insulators and metals on glass substrates is highly sensitive to the temperature of the glass deposition substrate. For example, the deposition temperature strongly affects the mobility of carriers in deposited amorphous silicon films and thereby affects the performance of MOSFETs formed from the deposited amorphous silicon films. Accordingly, it is important to maintain the deposition substrate at an appropriate temperature, as well as to maintain a uniform temperature across the surface of the deposition substrate.

As is typical of vacuum deposition systems, glass deposition substrates are loaded into a thin film deposition system through a vacuum load lock. Because of the sensitivity of the thin film deposition process to the temperature of the deposition substrate, a number of precautionary steps are taken to ensure that the glass substrate is brought to the appropriate temperature before deposition begins. After a batch of glass substrates is admitted to the deposition system, the substrates are heated in a preheat chamber until they reach a temperature near the target deposition temperature. Once the substrates have preheated to a sufficient degree, one of the substrates is transferred to the deposition chamber by a substrate transfer robot in preparation for thin film deposition. Even if the transfer operation is performed quickly, the glass substrate will cool markedly during the transfer operation. Thus, the substrate must be preheated again to ensure that the substrate has uniformly obtained the appropriate deposition temperature.

The duration of this second preheat step is referred to as the "soak" time. The deposition substrate must be heated for a sufficient time to ensure that the deposited films will have the desired characteristics, otherwise there is a risk that devices formed using the deposited films will have poor performance characteristics. It is thus desirable to preheat the substrate for sufficient time to ensure that the substrate has attained the desired deposition temperature. The soak time directly impacts the possible throughput of a given thin film deposition system because deposition cannot take place during the soak time. It is therefore desirable to optimize the soak time so that the second preheat step takes only as long as is necessary to ensure that the substrate is at the appropriate temperature.

While it is highly desirable to monitor the temperature of the deposition substrate in situ to establish when the deposition substrate has reached an appropriate deposition temperature, it is very difficult to accurately measure the temperature of a substrate within the deposition chamber. For example, it is typically unsatisfactory to measure the temperature of the susceptor on which the substrate rests during deposition. The pressure in the deposition chamber is typically about 5 Torr, which means that, even when the substrate is in physical contact with the susceptor, there is too little gas conduction between the deposition substrate and the susceptor to keep the substrate and the susceptor in good thermal contact. The temperature of the susceptor is therefore a poor measure of the temperature of the deposition substrate. Similarly, a thermometer mounted adjacent to the substrate would not be in sufficient thermal contact with the substrate to accurately measure the temperature of the substrate.

Pyrometry has been used to monitor the temperature of semiconductor wafers during processing. U.S. patent application Ser. No. 08/021,840, now abandoned entitled "Measuring Wafer Temperatures," lists Christian Gronet and Gary Miner as inventors and is assigned to the assignee of the present invention. The Gronet application describes a pyrometry system for measuring the temperatures of semiconductor wafers during processing. In particular, the Gronet pyrometer is designed for measuring the temperature of semiconductor wafers having unpredictable or low emissivities. A cavity is formed adjacent to the wafer whose temperature is to be measured and blackbody radiation within this cavity is sampled to yield information about the temperature of the wafer. The pyrometer described in the Gronet application is ill-suited to measure the temperature of glass substrates in thin film deposition systems because no cavity can be formed adjacent to the glass substrate without diminishing the quality of thin films formed on the glass substrate. No cavity can be formed on the side of the substrate that is away from the susceptor because thin films must be deposited over that entire surface. Forming a cavity on the susceptor side of the glass substrate is unacceptable because it is likely that temperature of the glass substrate would drop slightly in the region adjacent to the cavity. Even slight variations in the temperature of the glass deposition substrate are typically undesirable for thin film deposition systems. Moreover, the blackbody radiation associated with the susceptor itself is likely to dominate the blackbody radiation formed in a cavity disposed on the susceptor side of the deposition substrate.

SUMMARY OF THE PREFERRED EMBODIMENTS

In accordance with one aspect of the present invention, a thin film deposition system comprises a susceptor for supporting a deposition substrate during a deposition process. A channel is formed in the susceptor, with the channel having an opening on the upper surface of the susceptor. An infrared detector is disposed to receive an optical signal that passes through the channel along an optical path from the opening to the infrared detector.

In accordance with a further aspect of the present invention, the output signal from the infrared detector is coupled to electronics capable of calculating the temperature of a blackbody on the basis of the blackbody's radiation characteristics.

In accordance with a further aspect of the present invention, the deposition system includes a hollow lightguide extending from the susceptor and defining an optical path to the infrared detector.

In accordance with another aspect of the present invention, a method of depositing thin films includes the steps of transporting a deposition substrate to the surface of a heated susceptor and heating the deposition substrate to a target temperature. Radiation from the deposition substrate is collected and the apparent temperature of the deposition substrate is determined from the infrared radiation emitted by the deposition substrate.

In accordance with a further aspect of the present invention, the above method can include the further steps of transporting a cold substrate to the surface of the susceptor and measuring a level of background radiation before the cold deposition substrate is substantially heated. A background reference signal is stored and subsequent temperature measurements are made relative to the background reference signal.

DETAILED DESCRIPTION OF THE PREFERRED EMBODIMENTS

Preferred embodiments of the present invention utilize optical pyrometry to measure the temperature of a deposition substrate within the deposition chamber of a thin film deposition system. For example, an infrared detector may be disposed so as to image a small portion of the backside of a deposition substrate within the deposition chamber. A lightguide leading from the backside of the deposition substrate toward the infrared detector acts as a shield to reduce the level of background radiation that is incident into the infrared detector. In particularly preferred embodiments, the intensity of the infrared radiation received by the infrared detector is measured, and the temperature of the deposition substrate is determined from the blackbody radiation emitted by the backside of the deposition substrate. The output from the infrared detector may be coupled into the control system of the thin film deposition system so that the system may utilize the temperature information to determine when a deposition process can begin.

Optical pyrometry is based on the principle that materials of a given temperature radiate energy in accordance with Planck's law:

$$u(v) = \frac{8\pi h v^3}{c^3} \frac{1}{e^{hv/kT} - 1}$$

wherein "v" (the greek letter nu) represents frequency, "h" is Planck's constant, "c" represents the speed of light, and "T" is the absolute temperature. Planck's law sets forth as a function of temperature the amount of energy radiated at a given frequency by a perfect blackbody. The radiant emittance of a blackbody having an absolute temperature of "T" is governed by the Stefan-Boltzmann relationship, that is, the total power emitted per unit area of a blackbody is equal to $\sigma \cdot T^4$, where $\sigma$ is Stefan's constant. Thus, both the spectrum of the radiated energy and the total intensity of the radiated energy are related to the temperature of the radiating body. The temperature of an object can therefore be determined by observing either the wavelength dependence of the energy radiated by the object, or by measuring the total intensity radiated from an area of known size on the surface of the object. Particularly preferred embodiments of the present invention are used to monitor the temperature of glass substrates, which have emissivities of approximately one. Thus, the temperature of a glass substrate can readily be determined from experimental observations of either the spectral energy distribution of the blackbody radiation or the total intensity of the blackbody radiation.

Figure 1:
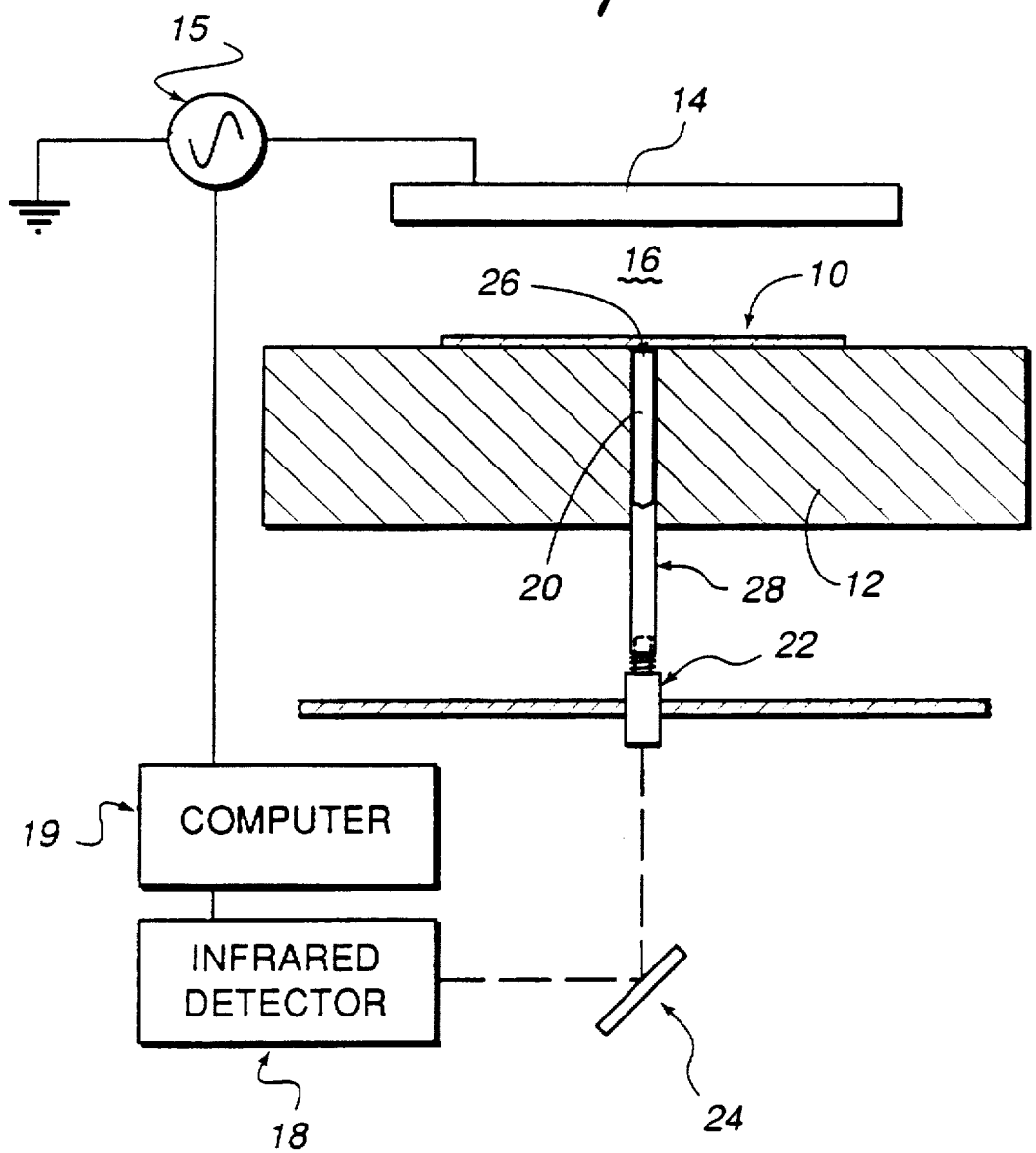
FIG. 1 illustrates a thin film deposition system in accordance with the present invention.

FIG. 1 illustrates a preferred embodiment of the present invention. The illustrated system is configured so that thin film deposition can begin, with a deposition substrate 10 disposed on the surface of a susceptor 12 and adjacent and parallel to an RF (radio frequency) electrode 14. The deposition substrate 10 may be a piece of glass being processed to form a liquid crystal display device. In the illustrated embodiment, the RF electrode 14 is coupled to an RF power supply 15. During deposition, an RF field is maintained between the RF electrode 14 and the susceptor 12 to excite a plasma in the region 16 above the deposition substrate 10. Molecular gases are excited in the plasma region 16 and subsequently the gases or portions of the gases deposit on the surface of the deposition substrate 10 to form thin film layers on the substrate. The thin film deposition system preferably employs a massive aluminum block as the susceptor 12 to heat the substrate 10 to an appropriate temperature for deposition to occur. Preferably, the temperature of the susceptor 12 is heated to a deposition temperature of between about 300° C. to 400° C. and the susceptor temperature is maintained to within about ±1° C.

In the course of operation, new deposition substrates 10 are transported from a preheat chamber (not shown) to the susceptor 12 by a transport robot. The temperature of the deposition substrate 10 falls as the substrate is transported from the preheat chamber to the surface of the susceptor 12 and the deposition substrate 10 must be (re-)heated to an appropriate temperature before deposition can begin. Deposition systems in accordance with the present invention include a temperature measurement system for monitoring the temperature of the deposition substrate 10. In this way, the substrate can reliably be heated to an appropriate deposition temperature before a deposition process begins.

Objects at room temperature, or at the moderately elevated temperatures at which the substrate 10 and susceptor 12 are maintained during thin film deposition, emit blackbody radiation primarily in the infrared region. In other words, both the deposition substrate 10 and the susceptor 12 will emit optical radiation having a continuous spectrum of wavelengths, the majority of which are within the infrared region. A thin film deposition system in accordance with the present invention preferably measures the temperature of the deposition substrate 10 at infrared wavelengths. The system illustrated by FIG. 1 includes a temperature measurement system having an infrared detector 18 disposed away from both the susceptor 12 and the deposition substrate 10. In the illustrated embodiment, an optical path extends from the backside of the deposition substrate 10, through a channel 20 formed in the susceptor 12, through an infrared window 22, off of a mirror 24 and to the infrared detector 18. Preferably, the temperature measurement region 26 on the backside of the deposition substrate 10 and the channel 20 formed in the susceptor 12 are made small so as to limit the amount of cooling that occurs on the deposition substrate 10 due to the presence of the channel 20 in the susceptor 12. For example, the temperature measurement region 26 may be circular with a diameter of less than one quarter of one inch. In practice, the allowable size of the temperature measurement region 26 varies depending on the temperature sensitivity of the deposition process and the thermal conductivity of the deposition substrate 10, and will further depend on how much viewing area is needed to reliably measure the temperature of the backside of the deposition substrate.

In particularly preferred embodiments of the present invention, a hollow lightguide 28 extends from the temperature measurement region 26 to the infrared window 22. The walls of the tube-like lightguide 28 preferably do not contact the walls of the susceptor which form the channel 20. Any level of separation reduces the efficiency of heat transfer between the susceptor 12 and the lightguide 28, allowing the lightguide to remain at a lower temperature than the susceptor itself. The cooler walls of the lightguide 28 act to shield the detector from the radiation emitted by the susceptor and to thus limit the level of background radiation collected by the detector 18. To reduce the temperature of the walls of the lightguide 28 and consequently reduce the level of background radiation incident on the detector, the lightguide 28 is preferably formed separate from the susceptor 12. A loose mechanical fit between the susceptor 12 and the lightguide 28 reduces the efficiency of the thermal conduction between the susceptor 12 and the lightguide 28, thereby reducing the temperature of the walls of the lightguide 28.

Figure 2:
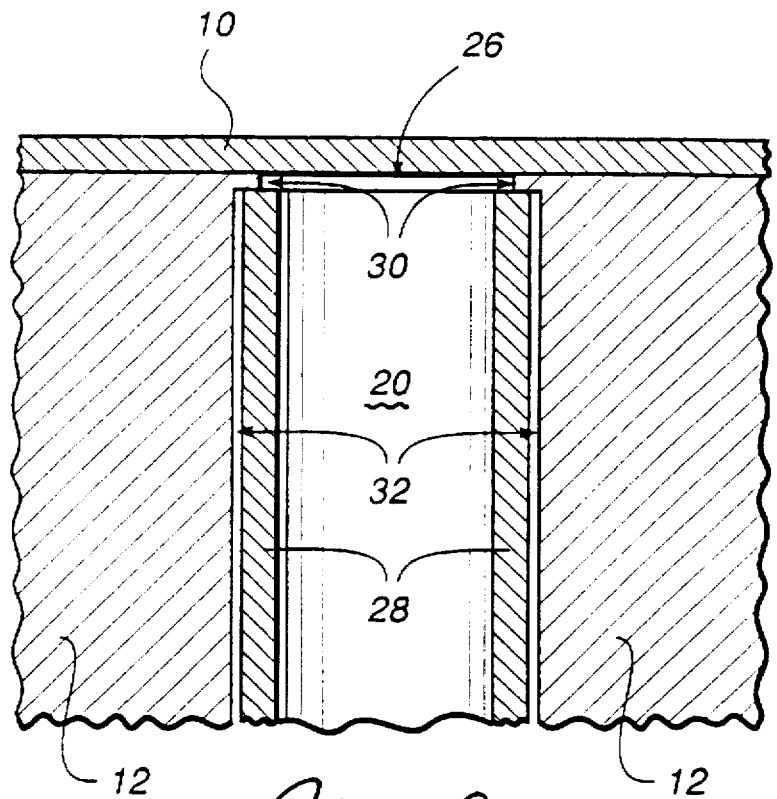
FIG. 2 illustrates an expanded view of a section of the thin film deposition system of FIG. 1.

FIG. 2 illustrates a portion of the junction between the susceptor 12 and the lightguide 28 for a preferred embodiment of the present invention. A ledge 30 extends from the inner walls 32 of the susceptor 12 adjacent to the temperature measurement region 26. The ledge 30 serves to keep the end of the lightguide 28 from touching the backside surface of the deposition substrate, thereby reducing the amount of heat transfer between the backside of the deposition substrate 10 and the lightguide 28. Use of the ledge 30 reduces the risk of developing a cold spot on the deposition substrate 10 produced by the lightguide 28 contacting the deposition substrate and allowing heat to flow along the lightguide 28. The ledge 30 is preferably made thin to limit the amount of background radiation imaged from the ledge 30 onto the infrared detector 18. There are, of course, other ways of maintaining the preferred separation between the deposition substrate 10 and the lightguide 28.

In the embodiment illustrated in FIG. 1, infrared radiation from the backside of the deposition substrate passes through an infrared window 22 before it reaches the detector 18. The primary function of the infrared window 22 is to provide an optical path through the chamber wall for the pyrometry measurement so that the infrared detector 18 can be located outside the vacuum environment of the deposition chamber. Accordingly, a vacuum seal is maintained around the window 22, which has sufficient mechanical strength to withstand the vacuum pumping process. It is preferred that the window be highly transmissive at infrared wavelengths, and that the window have a substantially flat transmission curve for infrared radiation. It is possible to measure the transmission curve and to adjust the calculation of the temperature from the intensity of the blackbody radiation on the basis of the transmission curve. Since calibration of the temperature measurement system may be accomplished using empirical methods, the effects of the transmission curve on the intensity can be measured when calibrating the system. A number of materials are available which have appropriate characteristics to serve as the infrared window 22, i.e., the materials are transmissive in a band between about four microns and fourteen microns and have relatively flat transmission spectra. One suitable material for the infrared window is AMTIR-1, which is a germania glass manufactured by Amorphous Materials, Inc., of Garland Tex.

Figure 3:
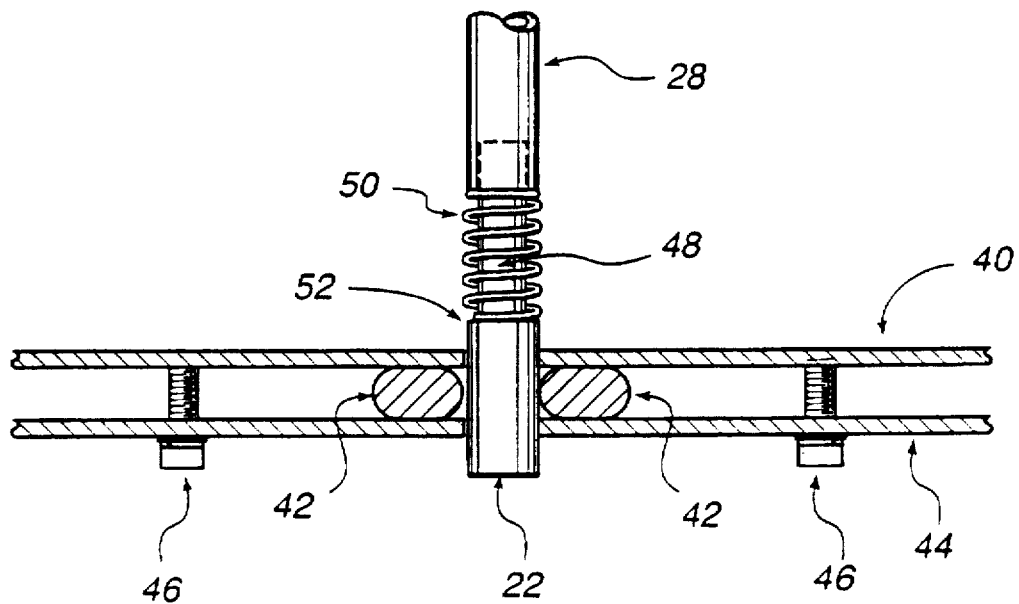
FIG. 3 illustrates an expanded view of a section of the thin film deposition system of FIG. 1.

FIG. 1 shows that the lightguide 28 extends from the backside of the deposition substrate 10 to the infrared window 22. Preferably, the size of the infrared window 22 is chosen so that the lightguide 28 slides over the end of the infrared window 22. For example, the infrared window may preferably be machined down to have a circular cross section which fits within the inner diameter of the lightguide 28. An embodiment of the infrared window 22 is shown in the partial assembly illustrated by FIG. 3. In particular, FIG. 3 shows an infrared window 22 in a vacuum mount used to form a vacuum seal between the infrared window 22 and vacuum wall 40 which faces the interior of the deposition chamber. The vacuum seal is formed by compressing an O-ring 42 fitted around the infrared window 22 and disposed between the vacuum wall 40 and compression wall 44. As the bolts 46 are tightened, the O-ring 42 compresses to form a vacuum joint with the vacuum wall 40. At the same time, the O-ring spreads inward to form a vacuum-tight joint with the larger diameter portion of the infrared window 22. Other of the well known vacuum feed-through joints might be used to make this vacuum seal, as well.

FIG. 3 also shows the infrared window 22 mated with the lightguide 28. In this preferred embodiment of the present invention, the infrared window is machined so that a portion 48 of the window 22 adjacent to one end has a sufficiently small diameter that the window can fit inside of the lightguide 28. A spring 50 of an appropriate inner diameter is disposed about the small diameter portion 48 so that it makes contact with the shoulder 52 of the window and with the end of the lightguide 28. The spring 50 serves to keep tension on the lightguide so that it stays seated on the ledge 30 in the assembly illustrated in FIG. 2.

Referring again to FIG. 1, the infrared radiation from the backside of the deposition substrate preferably passes through the lightguide 28, through the infrared window 22, and on towards an infrared detector 18. Due to the restricted space available in the typical deposition system, it may be necessary to direct the optical path in such a way as to allow the infrared detector 18 to be placed in the available space. In the embodiment illustrated in FIG. 1, a mirror 24 directs toward the infrared detector 18 the infrared radiation which passes through the infrared window 22. Any metal mirror can be used to direct the infrared radiation, but first surface gold mirrors are particularly preferred because of their very high reflectivity and the extreme flatness of their reflectance spectrum in the infrared. Under some circumstances, it may be desirable to use a spherical or parabolic mirror instead of the flat mirror shown at 24. For example, a focusing mirror can be used to image the temperature measurement region 26 onto the surface of the infrared detector 18. Such an arrangement can be used to decrease the background radiation incident into the detector 18 if the appropriate spatial filtering is done to restrict the amount of radiation collected by the focusing mirror.

In preferred embodiments of the present invention, the vacuum wall 40 (see FIG. 3) is cooled to keep the infrared window from heating to an unacceptable temperature. In practice, the O-ring 42 is preferably maintained at a temperature below 200° C., which means that the O-ring typically has more stringent temperature requirements than the infrared window. A preferred cooling method is to direct water to the outside of the wall through cooling channels formed in or adjacent to the wall, as is generally practiced in the art.

An infrared detector 18 in accordance with the present invention may be one of a number of different types. A preferred embodiment of the present invention uses a Model OS62-MVC thermopile detector from Omega Corporation, of Stamford, Conn. Thermopile detectors tend to be inexpensive, have relatively flat response curves, and are relatively fast. Thermopiles derive these properties from the fact that the thermopile consists of an array of thermocouples disposed on a high emissivity substrate having a low thermal mass. Accordingly, the thermopile detector may be used for time varying and differential measurements in the present invention.

Output from the infrared detector 18 is provided to a computer 19 that preferably calculates a temperature on the basis of the measured intensity of infrared radiation. In addition, the output signal from the infrared detector may be coupled to a control system within the computer 19 which controls the deposition system in such a way that a deposition process does not begin until after the deposition substrate 10 has reached the target temperature for thin film deposition.

Glass deposition substrates, such as those used in forming liquid crystal display devices, are good candidates for optical pyrometers because, at typical thin film deposition temperatures, glass is a good blackbody. The fact that glass is a good blackbody at these temperatures is important for two reasons. First, it means that the glass has a relatively high emissivity within major portions of the radiation distribution described by Planck's law and radiates substantially in accordance with the blackbody radiation laws discussed above. An apparent temperature may therefore be calculated from the intensity of the blackbody radiation to determine to a close approximation the actual temperature of the substrate. Second, the fact that the glass is a good blackbody is important because it means that the glass will be opaque throughout most of the range of radiation wavelengths produced by that temperature of blackbody. Thus, the glass will not directly transmit the infrared tail of the intense blackbody radiation emitted by the plasma, and will act to shield the infrared detector from the plasma radiation. Because the glass is opaque through a range of wavelengths in the infrared, the infrared detector can image the backside of the glass deposition substrate within that range of wavelengths without compensating for the background radiation emitted by the plasma. Thus, it may be preferable to utilize a detector that is sensitive only within a narrow window of infrared wavelengths. For example, it may be useful to select a detector that is sensitive to wavelengths longer than about 5 µm. Because the amount of emitted blackbody radiation falls off substantially at longer wavelengths, it is typically acceptable to select a detector that is sensitive within a range of infrared wavelengths which might be, for example, between the wavelengths of 5 µm to 14 µm. In the alternative, a cutoff or bandpass filter may be disposed along the detector's optical path to limit the wavelength sensitivity of the system.

The thin film deposition environment contains a number of blackbody emitters which produce background radiation signals that must be compensated for to measure the temperature of the glass deposition substrate by pyrometry. Primary among the blackbody sources in the deposition environment is the plasma itself, which has an effective blackbody temperature on the order of thousands of degrees and emits broadband radiation including the entire optical and infrared ranges. The other major blackbody emitter is the susceptor 12 on which the deposition substrate 10 is disposed. Because the susceptor 12 is maintained at the target temperature for the deposition substrate 10, it will have a blackbody radiation spectrum very similar to that of the glass substrate. The plasma will be the dominant radiation source during deposition, however, because the absolute temperature of the plasma is several times that of the susceptor, which likely means that the plasma is the "brightest" blackbody emitter in the deposition environment.

To eliminate the plasma radiation from the field of view of the infrared detector, it is preferable to view the deposition substrate from the backside of the substrate. In this configuration, the deposition substrate can be used to shield the infrared detector from the plasma during the deposition process and from the RF electrode, which has a temperature of about 80° C., when no RF plasma is present. The substrate will be an effective shield only for those wavelengths at which the substrate is essentially opaque. For example, the glass typically used for producing liquid crystal displays is substantially transparent at visible wavelengths, and remains somewhat transparent for wavelengths as long as 4–4.5 µm. Thus, a glass deposition substrate will typically only be an effective radiation shield at wavelengths longer than about 5 µm. At shorter wavelengths, too much radiation from the plasma would be transmitted through a glass substrate to make reliable pyrometric temperature readings.

A second advantage to observing the backside of the deposition substrate is that the optical characteristics of the backside of the deposition substrate will not change appreciably during the deposition process. By contrast, the front surface of the deposition substrate will undergo change throughout the deposition process as increasing thicknesses of film are deposited on the surface of the substrate. Thus, the temperature of the substrate may be more simply determined from an observation of the backside of the deposition substrate, as compared to a measurement made from the frontside of the deposition substrate.

Viewing the deposition substrate from the backside and restricting the wavelength of the measurement to a region at which the deposition substrate is substantially opaque reduces the level of the background signal associated with the radiation from the plasma. However, in the typical configuration of a thin film deposition system, the backside of the deposition substrate 10 is disposed on a solid metal susceptor 12. The susceptor 12 is generally maintained at a temperature suitable for thin film deposition, which is typically between about 300° C. and 400° C. These temperatures are too high to operate most infrared detectors, including both semiconductor and pyroelectric detectors. Moreover, if the detector were maintained at a temperature near the temperature being measured, the blackbody radiation of the detector itself would likely be too high to allow accurate measurements to be made. It is therefore preferable to maintain the infrared detector distant from the body of the susceptor while still viewing the backside of the deposition substrate.

In preferred embodiments of the present invention, the temperature of the deposition substrate is viewed through a channel or hole in the susceptor. In this way, the infrared detector can be disposed distant from deposition substrate and the temperature of the substrate can be viewed from a distance. Preferably, the infrared radiation emitted by the backside of the deposition substrate 10 is channeled or guided to the infrared detector 18 through an optical path designed to maximize the radiation collected from the backside of the deposition substrate 10 and to minimize the amount of background radiation emitted by the susceptor 12 that is incident on the detector 18. For example, the lightguide 28 may be used to channel infrared radiation through the susceptor 12 from the backside of the deposition substrate 10. The lightguide 28 is preferably sufficiently smooth on its inner surface so that relatively little of the radiation emitted by the deposition substrate 10 is absorbed or reflected back toward the deposition substrate.

The lightguide 28 may be a ceramic tube and, in particular, may be an alumina tube. Alumina is a suitable material for use because it is stable over a wide range of temperatures and environmental conditions and because its elemental constituents, aluminum and oxygen, are found elsewhere in the processing environment. For example, the susceptor 12 is typically formed from aluminum, and glass deposition substrates typically include oxygen as an elemental constituent. It is generally advisable to not introduce different types of material into the thin film deposition environment to avoid the dangers of contamination or undesired reaction. Potential contamination problems may arise unexpectedly due to the harsh chemical environment of the deposition chamber and because of the very energetic reactions facilitated by the plasma. It is therefore simplest to only use materials that are already present in the deposition chamber environment so that no new contamination problems arise.

Because it is used in the chemically reactive environment of the deposition chamber, the emissivity of the lightguide may vary over time. Process gases from the plasma region may reach the inner surface of the lightguide and react with the lightguide material, even if the process gases are present only in greatly reduced quantities. Thus, a variety of chemical reactions may occur over time, altering the chemical composition of the lightguide and consequently altering the optical properties of the lightguide. For the purposes of the pyrometric system described herein, one of the most important of the optical properties that might change over time is the emissivity of the lightguide. For example, if the lightguide were formed from aluminum, prolonged exposure to some of the process gases used in thin film deposition might cause the inner surface of the lightguide to be converted into aluminum oxide. Aluminum oxide typically has a higher emissivity than does a polished piece of aluminum. Additionally, the chemical reaction which converts aluminum to aluminum oxide might cause the inner surface of the lightguide to become rougher, increasing the scattering of light from the walls of the lightguide. Similar chemical reactions or physical roughening may occur with other lightguide materials, as well.

If the optical properties of the lightguide, or any other optical component along the optical path from the backside of the deposition substrate to the infrared detector, vary over time, it may be preferable to periodically recalibrate the temperature measurement system. Calibration may be accomplished in a number of different ways. A deposition substrate may be fitted with a thermocouple or other thermometer to measure the actual temperature of the substrate for comparison with the pyrometric determined temperature. A different sort of recalibration may be performed to allow the pyrometric temperature measurements to be made as a differential measurement. For example, the background temperature measurement might be made by measuring the intensity of the background radiation when a "cold" glass substrate is moved into place on the susceptor. For the purposes of calibrating the temperature measurement system, a "cold" glass substrate is one having a sufficiently low temperature that the blackbody radiation from the substrate is a negligible proportion of the total intensity collected by the infrared detector. In practice, a room temperature substrate may be sufficiently cold to perform background measurements. In such a background measurement, the primary purpose of the cold glass substrate is to shield the infrared detector from any blackbody source disposed above the usual substrate position. Either the level of background radiation or the apparent background temperature can be used as a background radiation reference signal. The background reference signal is then stored in a memory either within the calculation electronics or in the deposition system's computer 19. Subsequent pyrometric measurements are made relative to the previously determined background radiation reference signal. In other words, the background radiation is "subtracted off" from the pyrometric measurements. The background measurement can be made as often as is necessary to maintain the accuracy of the temperature measurement.

Both aluminum and alumina may be suitable lightguide materials, but there are tradeoffs associated with the choice of one material or the other. For example, an aluminum tube having a highly polished inner surface is highly reflective and consequently is expected to have a substantially lower emissivity than an alumina tube. The use of an aluminum tube would therefore decrease the amount of background signal produced by the blackbody radiation from the walls of the lightguide. However, an alumina lightguide has greater chemical stability, and it is less likely that the optical properties of the lightguide will vary over time. Accordingly, the choice of lightguide material will often depend on the exact nature of the chemicals used for the thin film deposition. As discussed above, it is preferable that the lightguide be formed of a material already present in the deposition environment. It is, of course, possible to use a different material for the lightguide, if the material is chosen so as to not produce unacceptable contamination of the thin films deposited in the system.

A second design consideration in choosing the lightguide material is that the walls of the lightguide will conduct heat away from the deposition substrate. Such heat conduction can cause a local cold spot to develop on the surface of the deposition substrate. The surface of such a cold spot might have a temperature slightly lower than surrounding regions of the deposition substrate, and might produce measurably different electrical properties in the films deposited in that region. Unacceptable uniformity variations in the deposited thin films might result if the temperature drop at the surface of the substrate were sufficient to produce measurable differences in the properties of thin films deposited in that region. To reduce the amount of heat conducted away from the deposition substrate, the walls of the lightguide are preferably made as thin as possible so that the lightguide has as low of a thermal conductivity as possible, while still maintaining sufficient mechanical strength to survive vacuum pumping cycles within the deposition environment. To further reduce the amount of heat flow away from the surface of the deposition substrate, it is desirable to form the lightguide from a low thermal conductivity material. From this point of view, a ceramic tube is more desirable than an aluminum tube. However, because thermal conductance is a function of the cross sectional area of the lightguide and because an aluminum tube can have substantially thinner walls than a ceramic tube, an aluminum tube can be made to have a thermal conductance approaching that of a ceramic tube.

The lightguide is preferably physically isolated from the susceptor along almost all of its length to reduce the background radiation from the walls of the tube. Under some circumstances, however, the lightguide itself may be a part of the susceptor 12. For example, the susceptor 12 may be formed from aluminum, the optical emissivity of the aluminum inner surface of the channel through the susceptor may not vary unacceptably with time, and the signal output from the deposition substrate may be sufficiently strong so that the blackbody radiation of the susceptor can be adequately subtracted. Considerable accuracy could be lost using such a configuration, however, and it is believed that such a configuration will not produce satisfactory temperature tracking capability in some circumstances.

While the present invention has been described with reference to specific preferred embodiments thereof, it will be understood by those skilled in this art that various changes may be made without departing from the true spirit and scope of the invention. In addition, many modifications may be made to adapt the invention to a given situation without departing from its essential teachings.

What is claimed is:

1. A method of depositing thin films of material comprising:

transporting a deposition substrate to a surface of a heated susceptor;

heating said deposition substrate to a target temperature;

passing infrared radiation from said deposition substrate through a hollow lightguide disposed within a channel formed in said susceptor;

collecting said infrared radiation within a range of infrared wavelengths from said deposition substrate;

determining an apparent temperature of said deposition substrate from said infrared radiation collected from said deposition substrate; and depositing a layer of material on said deposition substrate.

2. The method of claim 1 wherein said hollow lightguide comprises a cylindrical tube having an inner surface that is highly reflective at infrared wavelengths.

3. The method of claim 1 wherein the determining an apparent temperature comprises:

measuring the intensity of said infrared radiation from said deposition substrate; and calculating said apparent temperature on the basis of the blackbody radiation characteristics of said deposition substrate.

4. The method of claim 1 wherein depositing a layer of material on said deposition substrate is controlled to begin when said apparent temperature is equal to said target temperature.

5. The method of claim 1 further comprising:

transporting a cold deposition substrate to said surface of said susceptor;

measuring a level of background radiation before said cold deposition substrate is heated;

storing a background reference signal; and making successive temperature measurements relative to said background reference signal.

6. The method of claim 5 wherein the collecting infrared radiation comprises:

passing said infrared radiation from said deposition substrate through an infrared window; and directing said infrared radiation from said deposition substrate to an infrared detector.

7. The method of claim 6 wherein the passing infrared radiation from said deposition substrate through a hollow lightguide further comprises shielding said infrared detector from a background radiation signal produced by said susceptor.

8. A method of depositing thin films of material comprising the steps of:

transporting a deposition substrate to a surface of a heated susceptor;

heating said deposition substrate to a target temperature;

collecting infrared radiation within a range of infrared wavelengths from said deposition substrate;

directing said infrared radiation from said deposition substrate to an infrared detector;

shielding said infrared detector from a background radiation signal produced by said susceptor;

determining an apparent temperature of said deposition substrate from said infrared radiation collected from said deposition substrate; and depositing a layer of material on said deposition substrate.

9. The method of claim 8 wherein the step of determining an apparent temperature comprises the steps of:

measuring the intensity of said infrared radiation from said deposition substrate; and calculating said apparent temperature on the basis of the blackbody radiation characteristics of said deposition substrate.

10. The method of claim 8 wherein the step of depositing a layer of material on said deposition substrate is controlled to begin when said apparent temperature is substantially equal to said target temperature.

11. The method of claim 8 further comprising the steps of:

transporting a cold deposition substrate to said surface of said susceptor;

measuring a level of background radiation before said cold deposition substrate is substantially heated;

storing a background reference signal; and making successive temperature measurements relative to said background reference signal.

12. The method of claim 11 wherein the step of collecting infrared radiation comprises the steps of:

passing said infrared radiation from said deposition substrate through a channel formed in said susceptor; and passing said infrared radiation from said deposition substrate through an infrared window.

13. A method of depositing thin films of material comprising:

transporting a deposition substrate to a surface of a heated susceptor;

heating said deposition substrate to a target temperature;

passing infrared radiation from said deposition substrate through a channel formed in said susceptor;

passing said infrared radiation from said deposition substrate through an infrared window;

directing said infrared radiation from said deposition substrate to an infrared detector;

determining an apparent temperature of said deposition substrate from said infrared radiation collected from said deposition substrate; and depositing a layer of material on said deposition substrate.

14. The method of claim 13 wherein the determining an apparent temperature comprises:

measuring the intensity of said infrared radiation from said deposition substrate; and calculating said apparent temperature on the basis of the blackbody radiation characteristics of said deposition substrate.

15. The method of claim 13 wherein the depositing of a layer of material on said deposition substrate is controlled to begin when said apparent temperature is equal to said target temperature.

16. The method of claim 13 further comprising:

transporting a cold deposition substrate to said surface of said susceptor;

measuring a level of background radiation before said cold deposition substrate is heated;

storing a background reference signal; and making successive temperature measurements relative to said background reference signal.

17. The method of claim 16 further comprising shielding said infrared detector from a background radiation signal produced by said susceptor.

18. The method of claim 16 further comprising passing said infrared radiation from said deposition substrate through a hollow lightguide to shield said infrared detector from a background radiation signal produced by said susceptor.

19. The method of claim 18 wherein said lightguide comprises a cylindrical tube having an inner surface that is highly reflective at infrared wavelengths.

20. A method of depositing thin films of material comprising:

transporting a deposition substrate to a surface of a heated susceptor;

heating said deposition substrate to a target temperature;

collecting infrared radiation within a range of infrared wavelengths from said deposition substrate;

directing said infrared radiation from said deposition substrate to an infrared detector, wherein said infrared detector is sensitive to infrared wavelengths longer than a system cutoff wavelength and wherein said infrared detector is insensitive to optical radiation having wavelengths shorter than or equal to said system cutoff wavelength, wherein said deposition substrate is transmissive to optical radiation having wavelengths shorter than said system cutoff wavelength and said deposition substrate is opaque to optical radiation having wavelengths equal to or longer than said system cutoff wavelength when said deposition substrate is at a deposition temperature;

determining an apparent temperature of said deposition substrate from said infrared radiation collected from said deposition substrate; and depositing a layer of material on said deposition substrate.

21. The method of claim 20 wherein the determining an apparent temperature comprises:

measuring the intensity of said infrared radiation from said deposition substrate; and calculating said apparent temperature on the basis of the blackbody radiation characteristics of said deposition substrate.

22. The method of claim 20 wherein the depositing a layer of material on said deposition substrate is controlled to begin when said apparent temperature is equal to said target temperature.

23. The method of claim 20 further comprising:

transporting a cold deposition substrate to said surface of said susceptor;

measuring a level of background radiation before said cold deposition substrate is heated;

storing a background reference signal; and making successive temperature measurements relative to said background reference signal.

24. The method of claim 23 wherein the collecting of infrared radiation comprises:

passing said infrared radiation from said deposition substrate through an infrared window; and directing said infrared radiation from said deposition substrate to an infrared detector.

25. The method of claim 24 further comprising shielding said infrared detector from a background radiation signal produced by said susceptor.

26. The method of claim 24 further comprising passing said infrared radiation from said deposition substrate through a hollow lightguide to shield said infrared detector from a background radiation signal produced by said susceptor.

27. The method of claim 26 wherein said lightguide comprises a cylindrical tube having an inner surface that is highly reflective at infrared wavelengths.

28. A method of depositing thin films of material comprising the steps of:

transporting a cold deposition substrate to a surface of a heated susceptor;

measuring a level of background radiation;

storing a background reference signal;

heating said deposition substrate to a target temperature;

collecting infrared radiation within a range of infrared wavelengths from said deposition substrate, wherein said step of collecting infrared radiation comprises the steps of:

passing said infrared radiation from said deposition substrate through a channel formed in said susceptor;

passing said infrared radiation from said deposition substrate through an infrared window; and directing said infrared radiation from said deposition substrate to an infrared detector;

shielding said infrared detector from a background radiation signal produced by said susceptor;

determining an apparent temperature of said deposition substrate from said infrared radiation collected from said deposition substrate;

making successive temperature measurements relative to said background reference signal; and depositing a layer of material on said deposition substrate.

29. A method of depositing thin films of material comprising the steps of:

transporting a cold deposition substrate to a surface of a heated susceptor;

measuring a level of background radiation;

storing a background reference signal;

heating said deposition substrate to a target temperature;

collecting infrared radiation within a range of infrared wavelengths from said deposition substrate, wherein said step of collecting infrared radiation comprises the steps of:

passing said infrared radiation from said deposition substrate through a channel formed in said susceptor;

passing said infrared radiation from said deposition substrate through a hollow lightguide to shield an infrared detector from a background radiation signal produced by said susceptor;

passing said infrared radiation from said deposition substrate through an infrared window; and directing said infrared radiation from said deposition substrate to said infrared detector;

determining an apparent temperature of said deposition substrate from said infrared radiation collected from said deposition substrate;

making successive temperature measurements relative to said background reference signal; and depositing a layer of material on said deposition substrate.

30. The method of claim 29 wherein said lightguide comprises a cylindrical tube having an inner surface that is highly reflective at infrared wavelengths.

* * * * *